(12) United States Patent
Hsu

(10) Patent No.: US 6,865,091 B2
(45) Date of Patent: Mar. 8, 2005

(54) MECHANISM FOR SUPPORTING EDGE OF MOTHERBOARD

(75) Inventor: Cheng-Chung Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/600,439

(22) Filed: Jun. 23, 2003

(65) Prior Publication Data

US 2004/0257783 A1 Dec. 23, 2004

(51) Int. Cl.⁷ .............................................. H05K 7/12
(52) U.S. Cl. .......................... 361/801; 361/747; 361/759
(58) Field of Search ................................ 361/801, 804, 361/807, 809, 796, 770, 732, 747, 742, 759, 752, 758, 730; 211/41.17

(56) References Cited

U.S. PATENT DOCUMENTS 5,502,620 A * 3/1996 Funck et al. ................. 361/753
6,424,538 B1 * 7/2002 Paquin ........................ 361/752
6,752,276 B2 * 6/2004 Rumney ..................... 211/41.17

* cited by examiner

Primary Examiner—Randy W. Gibson
Assistant Examiner—Dameon E. Levi
(74) Attorney, Agent, or Firm—Bacon & Thomas, PLLC

(57) ABSTRACT

A support mechanism for holding up an edge of a rectangular motherboard. The mechanism includes a first hook at one end, a second hook at the other end both fastened at a substantially parallelepiped case of an electronic device, and an arcuate support section between the first and the second hooks. The support section fits onto an edge of the motherboard when the motherboard is secured to the case of the electronic device by the support mechanism, fastening the edge of the motherboard and preventing the edges of the motherboard from vibrating or deforming when an external force is applied thereon during delivery.

7 Claims, 3 Drawing Sheets

MECHANISM FOR SUPPORTING EDGE OF MOTHERBOARD

FIELD OF THE INVENTION

The present invention relates to support mechanisms and more particularly to a support mechanism for holding up edge of a motherboard of computer with improved characteristics.

BACKGROUND OF THE INVENTION

A conventional arrangement of fastening motherboard of a typical electrical device (e.g., computer) is depicted in FIG. 1. As shown, the motherboard 10 comprises a plurality of elongated channels 11 each having a large, circular hole 111 in its center. A plurality of snapping members 12 corresponding the holes 111 are provided on a bottom of a substantially parallelepiped computer case. The snapping member 12 is a post-like element and comprises a round head 121, a neck 122 having a smaller diameter, and a base (not shown) coupled to the bottom of the case. In assembling the motherboard 10 in the computer case, first cling the hole 111 of the channel 11 of the motherboard 10 onto the neck 122 of the snapping member 12. Next, move the motherboard 10 toward one side until the neck 122 of the snapping member 12 is tightly fitted at one end of the channel 11. As a result, the motherboard 10 is fastened in the case.

Referring to FIG. 1 again, in a case that the motherboard 10 is required to detach from the case for maintenance, a person can move the motherboard 10 to align the hole 111 of the channel 11 with the head 121 of the snapping member 12. Thereafter, it is possible of detaching the motherboard 10 from the case. In view of the above, both assembly and disassembly of the motherboard 10 are made easy. However, the prior motherboard fastening arrangement suffered from a disadvantage in spite of the easiness of assembly and disassembly thereof. In brief, it lacks means for fastening edges of the motherboard 10. This is because widths of the edges are limited, thus prohibiting the provision of holes 11 by drilling. As such, edges of the motherboard 10 are susceptible of vibration or even deformation when an external force is applied 51 thereon in delivery. Unfortunately, such vibration or deformation may damage circuit devices of the motherboard 10. Thus, the need for improvement still exists.

SUMMARY OF THE INVENTION

A primary object of the present invention is to provide a support mechanism for holding up an edge of a rectangular motherboard. The support mechanism comprises a first hook at one end, a second hook at the other end both fastened at a substantially parallelepiped case of an electronic device, and an arcuate support section between the first and the second hooks. The support section fits onto an edge of the motherboard when the motherboard is secured to the case of the electronic device by the support mechanism, thereby fastening the edge of the motherboard and preventing the edges of the motherboard from vibrating or deforming when an external force is applied thereon in delivery. As an end, circuit devices of the motherboard are free from damage due to the elimination of the vibration. By utilizing this, the above drawback of the prior art, i.e., lacked means for fastening edges of motherboard, can be overcome.

In one aspect of the present invention, the support section of the support mechanism comprises an upper end slanted upward so that a large opening of the support section is obtained for facilitating a fitting of the edge of the motherboard into the support section.

In another aspect of the present invention, further comprises a reinforced ridge on a top of the upper end of the support section of the support mechanism for increasing a structural strength of the upper end of the support section.

The above and other objects, features and advantages of the present invention will become apparent from the following detailed description taken with the accompanying drawings.

DETAILED DESCRIPTION OF THE PREFERRED EMBODIMENTS

Figure 1:
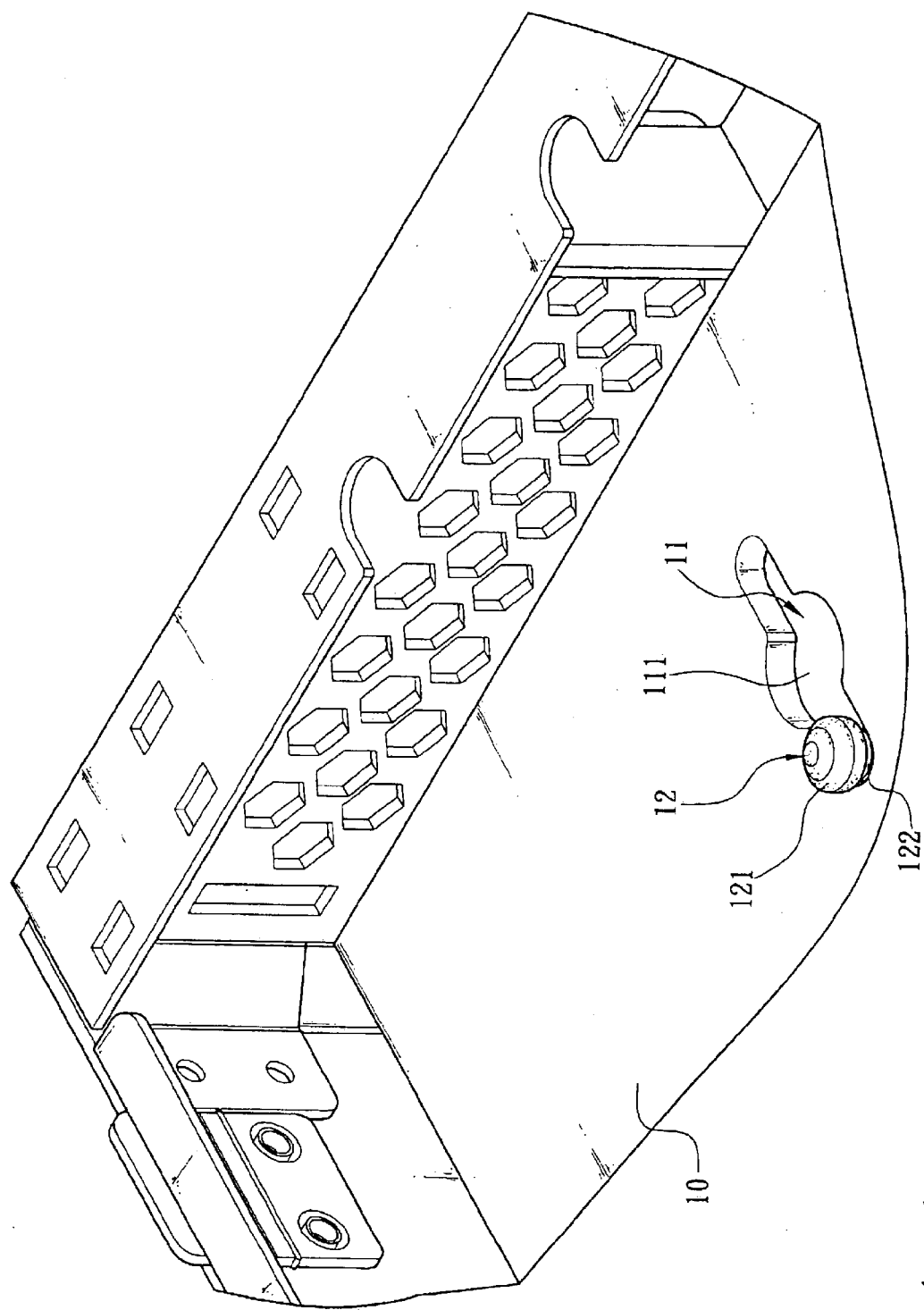
FIG. 1 is a perspective view depicting a conventional mechanism for fastening a motherboard in a bottom of computer case.
Figure 2:
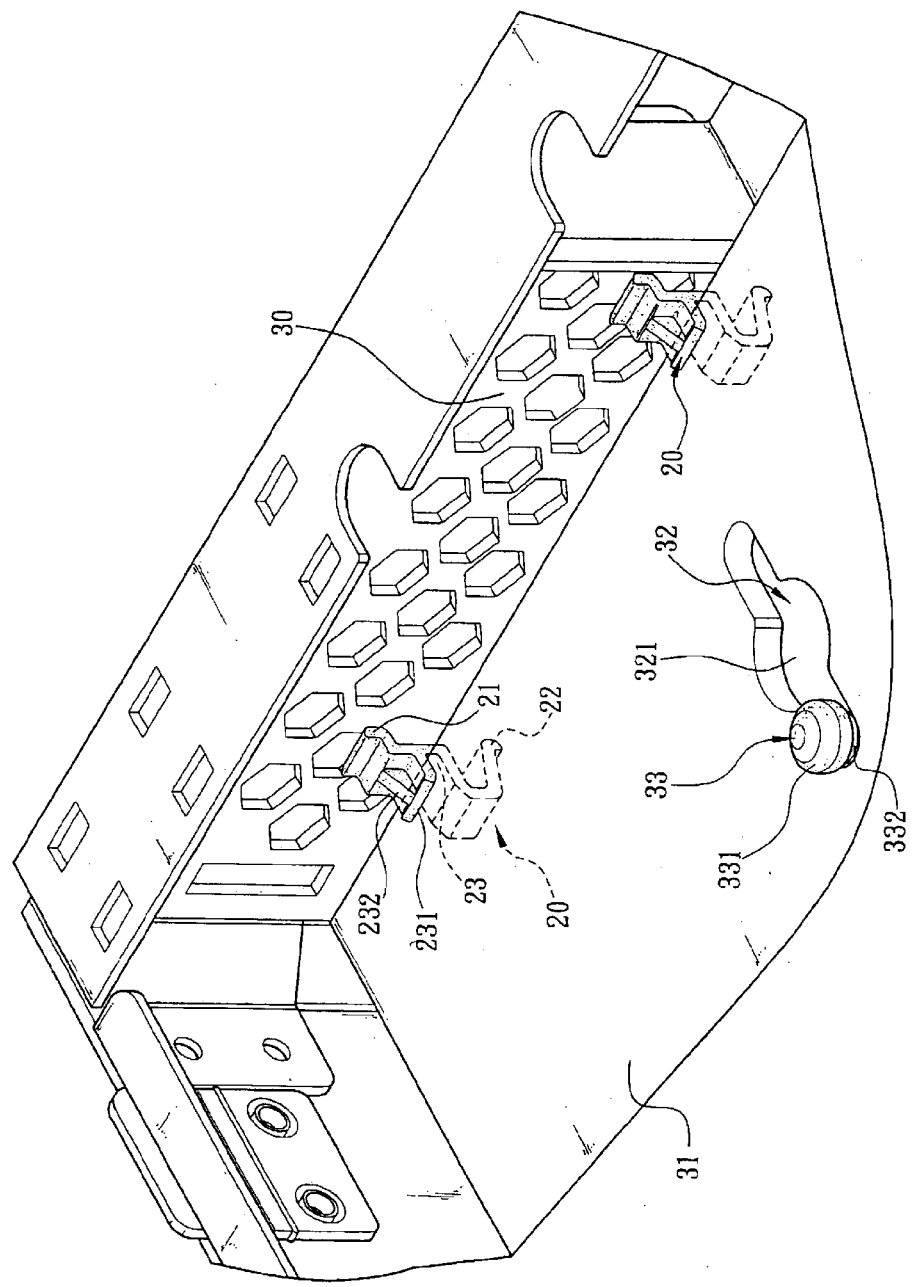
FIG. 2 is a perspective view depicting a preferred embodiment of support mechanism for holding up an edge of motherboard in a computer case according to the invention.
Figure 3:
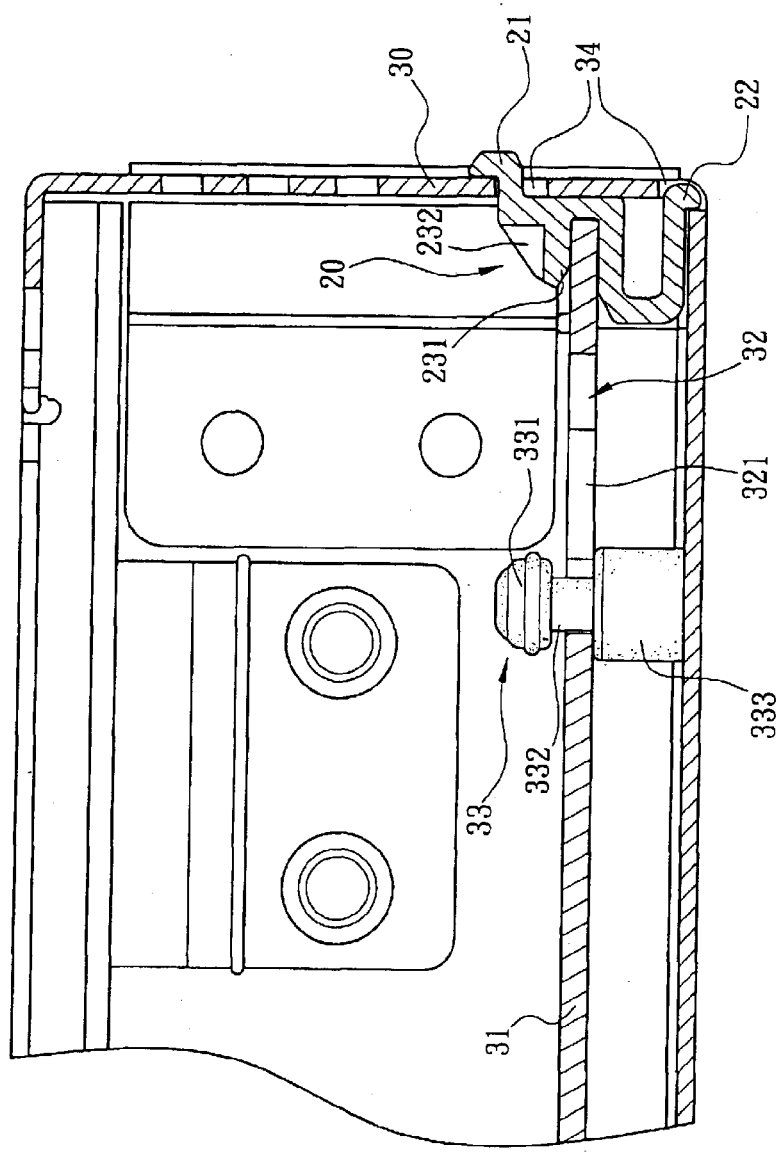
FIG. 3 is a sectional view of FIG. 2.

Referring to FIGS. 2 and 3, there is shown a support mechanism for holding up an edge of rectangular motherboard in accordance with the invention. The support mechanism 20 comprises a first hook 21 at an upper end and a second hook 22 at a lower end both fastened at a substantially parallelepiped case 30 of an electronic device (e.g., computer, industrial computer, cellular phone, etc.). The support mechanism 20 further comprises an arcuate support section 23 between the first and the second hooks 21 and 22. The support section 23 is adapted to fit onto an edge of a motherboard 31 when the motherboard 31 is secured to the case 30 of the electronic device by the support mechanism 20. As such, the edges of the motherboard 31 are fastened. Also, the edges of the motherboard 31 are free from vibration or even deformation when an external force is applied thereon in delivery. As an end, circuit devices of the motherboard 31 are free from damage due to the elimination of the vibration.

Referring to FIGS. 2 and 3 again, in the invention the motherboard 31 comprises a plurality of elongated channels 32 each having a large, circular, and central hole 321. A plurality of snapping members 33 corresponding the holes 321 are provided on a bottom of the case 30 of the electronic device. The snapping member 33 is a post-like element and comprises a round head 331, a neck 332 having a smaller diameter, and a base 333 coupled to the bottom of the case 30. In assembling the motherboard 31 in the case 30 of the electronic device, first cling the hole 321 of the channel 32 of the motherboard 31 onto the neck 332 of the snapping member 33. Next, move the motherboard 31 toward one side until the neck 332 of the snapping member 33 is tightly fitted at one end of the channel 32. As a result, the motherboard 31 is fastened in the case 30. In a case that the motherboard 31 is required to detach from the case 30 for maintenance, a person can move the motherboard 31 to align the hole 321 of the channel 32 with the head 331 of the snapping member 33. Thereafter, it is possible of detaching the motherboard 31 from the case 30 for maintenance.

Referring to FIGS. 2 and 3 again, in the invention a plurality of apertures 34 are provided at sides and corners of the case 30 of the electronic device. The apertures 34 correspond to and are mated with the first and the second hooks 21 and 22 of the support mechanism 20. In assembling the motherboard 31 in the case 30, first snap the first hook 21 into one of two adjacent apertures 34. Next, snap the second hook 22 into the other one of two adjacent apertures 34. As a result, the support mechanism 20 is secured to the case 30 of the electronic device.

Referring to FIGS. 2 and 3 again, in the invention an upper end 231 of the support section 23 of the support mechanism 20 is slanted upward. As such, a large opening of the support section 23 is obtained. This can facilitate a fitting of the edge of the motherboard 31 into the support section 23.

Referring to FIGS. 2 and 3 again, in the invention a reinforced ridge 232 is formed on a top of the upper end 231 of the support section 23 of the support mechanism 20. The reinforced ridge 232 is adapted to increase a structural strength of the upper end 231.

Referring to FIGS. 2 and 3 again, in the invention the support mechanism 20 is of plastic material formed integrally. As such, the support mechanism 20 has a predetermined flexibility.

Referring to FIGS. 2 and 3 again, in the invention the support mechanism 20 is of metal formed integrally in another embodiment.

While the invention has been described by means of specific embodiments, numerous modifications and variations could be made thereto by those skilled in the art without departing from the scope and spirit of the invention set forth in the claims.

What is claimed is:

1. A support mechanism for holding up an edge of a rectangular motherboard, comprising:

a first hook at one end, a second hook at the other end both fastened at a substantially parallelepiped case of an electronic device, and an arcuate support section between the first and the second hooks, wherein the support section fits onto an edge of the motherboard when the motherboard is secured to the case of the electronic device by the support mechanism, the support section comprises an upper end slanted upward so that a large opening of the support section is obtained for facilitating a fitting of the edge of the motherboard into the support section; and a reinforced ridge on a top of the upper end of the support section of the support mechanism for increasing a structural strength of the upper end of the support section.

2. The support mechanism of claim 1, wherein the motherboard comprises a plurality of elongated channels each having a large, circular, and central hole, and further comprising a plurality of post-like snapping members on a bottom of the case of the electronic device, the snapping members being adapted to correspond the holes, each of the snapping members comprising a round head, a neck having a smaller diameter, and a base coupled to the bottom of the case of the electronic device wherein in assembling the motherboard in the case of the electronic device, cling the hole of the channel of the motherboard onto the neck of the snapping member, and move the motherboard toward one side until the neck of the snapping member is tightly fitted at one end of the channel for fastening the motherboard in the case; and in detaching the motherboard from the case of the electronic device for maintenance, move the motherboard to align the hole of the channel with the head of the snapping member prior to detaching the motherboard from the case of the electronic device.

3. The support mechanism of clam 1, further comprising a plurality of apertures at sides and corners of the case of the electronic device, the apertures being adapted to correspond to and mate with the first and the second hooks of the support mechanism wherein in assembling the motherboard in the case of the electronic device, snap the first hook into one of two adjacent apertures and snap the second hook into the other one of the adjacent apertures, thereby securing the support mechanism to the case of the electronic device.

4. The support mechanism of claim 1, wherein the support mechanism is of plastic material formed integrally and has a predetermined flexibility.

5. The support mechanism of claim 1, wherein the electronic device is an industrial computer.

6. The support mechanism of claim 1, wherein the support mechanism is of metal material formed integrally.

7. The support mechanism of claim 1, wherein the electronic device is a cellular phone.

* * * * *